United States Patent
Schoenfeld

[11] Patent Number: 6,066,515
[45] Date of Patent: May 23, 2000

[54] MULTILEVEL LEADFRAME FOR A PACKAGED INTEGRATED CIRCUIT

[75] Inventor: Aaron Schoenfeld, Boise, Id.

[73] Assignee: Micron Technology, Inc., Boise, Id.

[21] Appl. No.: 09/072,889

[22] Filed: May 5, 1998

Related U.S. Application Data

[62] Division of application No. 08/807,418, Feb. 28, 1997.

[51] Int. Cl.⁷ .................................................. H01L 23/48
[52] U.S. Cl. ......................... 438/123; 438/106; 257/666; 257/669; 257/691; 257/692
[58] Field of Search ..................... 438/106, 123; 257/666, 669, 676, 691, 692

[56] References Cited

U.S. PATENT DOCUMENTS

| | | | |
|---|---|---|---|
| 4,796,078 | 1/1989 | Phelps, Jr. et al. | 357/68 |
| 4,862,245 | 8/1989 | Pashby et al. | 357/70 |
| 5,142,351 | 8/1992 | Matta | 257/691 |
| 5,252,854 | 10/1993 | Arita et al. | 257/691 |
| 5,286,999 | 2/1994 | Chiu | 257/666 |
| 5,331,200 | 7/1994 | Teo et al. | 257/691 |
| 5,358,598 | 10/1994 | Chiu | 29/827 |
| 5,394,008 | 2/1995 | Ito et al. | 257/691 |
| 5,461,255 | 10/1995 | Chan et al. | 257/672 |
| 5,550,401 | 8/1996 | Maeda | 257/691 |
| 5,751,057 | 5/1998 | Palagonia | 257/691 |

*Primary Examiner*—Donald L. Monin, Jr.
*Assistant Examiner*—Michael C Dietrich
*Attorney, Agent, or Firm*—Trask, Britt & Rossa

[57] ABSTRACT

The present invention is directed to a packaged semiconductor chip that utilizes a multilevel leadframe that positions the lead fingers close to the bond pads while positioning the bus bars on a different level and behind or outboard of the lead finger connections such that it is unnecessary for any wires to cross over the bus bars or the lead fingers. The leadframe may comprise a multi-part frame, or be fabricated from a single sheet of metal.

14 Claims, 12 Drawing Sheets

MULTILEVEL LEADFRAME FOR A PACKAGED INTEGRATED CIRCUIT

This application is a divisional of application Ser. No. 08/807,418 filed Feb. 28, 1997.

BACKGROUND OF THE INVENTION

1. Field of the Invention

The present invention relates to a leadframe structure used for making electrical connections to a semiconductor device. More particularly, the present invention relates to a multi-level leadframe configuration for improving reliability and performance by reducing the number of wires that must extend over or "jump" a bus bar in a lead-over-frame configuration.

2. State of the Art

A typical semiconductor chip is generally constructed from a semiconductor die which is in electrical communication with a component known as a leadframe. The semiconductor die and leadframe are usually sealed in an encapsulant, such as a transfer-molded plastic (filled polymer), wherein portions of the leadframe extend from the encapsulant to ultimately, after fitting and trimming, form electrical communication between the semiconductor die and external circuitry, such as a printed circuit board ("PCB") or the like.

The leadframe is typically formed from a single continuous sheet of metal by a metal stamping or etching operation. As shown in FIG. 15, a conventional lead frame 200 generally consists of an outer supporting frame 202, a central semiconductor chip or "die attach" supporting pad 204 and a plurality of lead fingers 206, each lead finger 206 extending toward the central chip supporting pad 204. Ultimately, the outer supporting frame 202 of the leadframe 200 is removed after wire bonds are connected between contact pads of a semiconductor die (not shown) and the lead fingers 206.

As shown in FIG. 16 (components common to FIGS. 15 retain the same numeric designation), a semiconductor die 208 having a plurality of bond pards 210 is secured to the central semiconductor chip supporting pad 204 (such as by solder or epoxy die-attach material, or a double-sided adhesive film). The leadframe 200, with the semiconductor die 208 attached thereon, is placed into a wire bonding apparatus including a clamp assembly for holding the leadframe and die assembly, as well as clamping the lead fingers 206 for bonding (not shown). Bond wires 212 of gold, aluminum, or other metals and alloys known in the art are attached, one at a time, from each bond pad 210 on the semiconductor die 208 and to its corresponding lead finger 206. The bond wires 212 are generally attached through one of three industry-standard wire bonding techniques, depending on the wire material employed: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts. After wirebonding, the assembly can be encapsulated as discussed above.

U.S. Pat. No. 4,862,245 issued Aug. 29, 1989 to Pashby et al. ("the Pashby patent") illustrates a so-called "leads over chip" arrangement ("LOC") on the semiconductor die. As shown in FIG. 17, in an LOC arrangement 300, a plurality of lead fingers 302 extends over the active surface of a semiconductor die 304 toward a line of bond pads 306 wherein bond wires 308 make the electrical connection between the lead fingers 302 and the bond pads 306. An alpha barrier 310, such as a polyimide (for example, Kapton™) film, is adhered between the semiconductor die 304 and the lead fingers 302. The LOC configuration as exemplified by the Pashby patent eliminates the use of the previously-referenced central die attach pad, may assist in limiting the ingress of corrosive environment contaminants, achieves a larger portion of the lead finger path length encapsulated in the packaging material, reduces electrical resistance caused by the bond wires (i.e., the longer the bond wire, the higher the resistance), and reduces the potential for wire sweep problems aggravated by long wire loops.

In a conventional configuration (non-LOC), some of the lead fingers carry input or output signals to or from the semiconductor die while others provide a power source or a ground. In an LOC configuration, the lead fingers likewise provide the input or output signals to or from the semiconductor device, but the power source and ground are typically provided by bus bars. The bus bars form an elongated contact in close proximity to the bond pads and typically lie in a perpendicular orientation to the other lead fingers. It is, of course, understood that the bus bars can also carry an input or an output signal which is usually common to more than one bond pad.

A conventional LOC configuration 400, including bus bars, is shown in FIG. 18. A semiconductor die 402 is housed within the integrated circuit chip package 400. A leadframe 404 includes a plurality of lead fingers 406 and 408 extending over the surface of the die toward bond pads 410. The leadframe 404 also includes bus bars 412 and 414. The bus bars 412 and 414 and the lead fingers 406 and 408 are connected to the bond pads 410 by bond wires 416. One problem with the conventional LOC configuration is that the bond wires 416 must jump or cross over the bus bars 412 and 414 in order to make their respective connections with the bond pads 410. This jumping gives rise to the possibility of shorting between the lead fingers 406 and 408 and the bus bars 412 and 414. In addition, the bond wires 416 must be of extended length to jump the bus bars 412 and 414. This additional bond wire length also adds undesirable inductance and capacitance to the signals, potentially degrading the electrical performance of the semiconductor device. Moreover, the height of the bond wires 416 jumping over the bus bars 412 and 414 are also problematic for thin profile semiconductor packages, such as TSOPs (thin, small outline packages). The bond wires 416 may actually extend out of the encapsulant material used to protect such thin profile semiconductor packages.

U.S. Pat. No. 4,796,078 issued Jan. 3, 1989 to Phelps, Jr. et al. illustrates a multi-layered leadframe assembly. A semiconductor die is bonded to a recess in a first, lower leadframe. Wire bonds extend from lead fingers of the first leadframe terminating short of the sides of the die to peripheral bond pads. A second, upper leadframe of an LOC configuration is secured to the top of the semiconductor die and the first leadframe with an adhesive tape. The lead fingers of the second leadframe extending over the die have selected wire bonds made to central terminals by bondwires. Thus, it appears that LOC technology is integrated with a conventional peripheral-lead attachment. One problem with this type of configuration is that it requires a central die attach pad that was essentially eliminated by use of LOC technology.

U.S. Pat. No. 5,461,255 issued Oct. 24, 1995 to Chan et al. also illustrates a multi-layered leadframe assembly. As shown in FIG. 19, the Chan type of main leadframe 500 comprising a plurality of leads 502 is adhered to the active face 504 of an integrated circuit chip 506 by an insulating adhesive tape strip 508. A bus leadframe 510 comprising a plurality of conductive leads 512 is then adhered to the opposite, upper side of the main leadframe 500 by an insulating adhesive tape strip 514. The selected lead 502 of the main leadframe 500 are welded at spot welds 516 to the selective leads 512 of the bus leadframe 510. The selective leads 502 of the main leadframe 500 are electrically connected at their inner ends to bond pads 518 on the integrated circuit chip 504 by tab bonds 520. Alternatively, wire bonds may be used. This configuration suffers from at least one disadvantage in that the bus leadframe 510 comprises a plurality of conductive leads 512 which are connected at their ends to select leads 502 of the main leadframe 500 at spot welds 516. Thus, a plurality of leads of the main lead frame is required to electrically connect the bus bar to the bond pads. As semiconductor circuits have become smaller and more complex, it has become more important to limit the number of leads used for power and ground sources because the leads are required for carrying signals and because of physical limitations on reducing the size of the leads. Therefore, it is important to conserve as many leads as possible for signal transmission by reducing the number used for power and ground source. In addition, the plurality of spot welds increases the time and number of operations required to manufacture the integrated circuit package, thus increasing the cost of production.

U.S. Pat. No. 5,331,200 issued Jul. 19, 1994 to Teo et al. illustrates a multi-layered leadframe assembly to facilitate direct inner lead bonding for both the power bus and the main leadframe. As shown in FIG. 20, bus bar frames 600 and 602 are separate bars that are attached to both main leadframe fingers 604 and 612. Bus bar frames 600 and 602 provide bus bar bond fingers 606 and 608 that extend to bond pads 610 for connection directly to the bond pads using inner lead bonding techniques. The bus bar frames 600 and 602 are joined to the main leadframe by external lead bonding methods or adhesive tape. One disadvantage of this configuration is the use of inner lead bonding techniques, which may require tooling changes and design changes for a system previously constructed to use wire bonding techniques. Another disadvantage of the inner lead bonding technique is the need to redesign the location of the bond fingers when the design of the integrated circuit is changed. Thus, should the location of bond pads be changed due to a change (such as a die "shrink") in the integrated circuit design, new bus bar frames will be required with the bus bar bond fingers reconfigured.

U.S. Pat. No. 5,286,999 issued Feb. 15, 1994 to Chiu illustrates a conventional LOC leadframe with the bus bar folded under the lead fingers. As shown in FIGS. 21–22, a bus bar 700 is folded under lead fingers 702 and connected to the lead fingers 702 at the outer ends of a row of lead fingers 702. A strip of insulating material 704 is placed between the bus bar 700 and the lead fingers 702. The lead fingers 702 and the bus bar 700 are attached to bond pads 706 on the semiconductor chip 708 by bond wires 710. The bus bar 700 and lead fingers 702 are etched so that the thickness of the lead finger, bus bar, and tape when folded together is no more than the thickness of the leadframe lying outwardly of the folded assembly. One problem with this type of configuration is the difficulty in folding the bus bar under the lead fingers. There is also a chance of damaging the leadframe assembly while attempting to fold the bus bar under the lead fingers.

U.S. Pat. No. 5,550,401 issued Aug. 27, 1996 to Maeda illustrates a conventional LOC leadframe with the bus bar folded back over the lead finger. As shown in FIGS. 23–24, a leadframe 800 is formed by folding a bus bar 802 back over lead fingers 804. The bus bar 802 also includes finger portions 806 which are formed in folding back the bus bar 802. These finger portions 806 align in the same plane with the lead fingers 804 and are attached coextensive with the lead fingers 804. While this type of configuration eliminates the problem associated with lead wires crossing over the bus bar 802 or other lead fingers 804, the process requires precise folding of the bus bar 802 back over the lead fingers 804 without bending the finger portions 806 from their planar alignment with the lead fingers 804. This precise processing step would increase the processing cost of the leadframe.

Thus, it would be advantageous to develop a simple and relatively inexpensive leadframe configuration such that the bond pads could be electrically connected to the lead fingers and the bus bars using typical wire bonding techniques without having lead wires cross over or "jump" the bus bars or other lead fingers.

SUMMARY OF THE INVENTION

The present invention relates to an easily fabricated leadframe configuration for minimizing the number of bond wires that must cross over a bus bar in an LOC type configuration.

The present invention comprises a multilevel leadframe that positions the lead fingers close to the bond pads while positioning the bus bars on a different level or plane and behind or outboard of the lead finger connections such that it is unnecessary for any bond wires to cross over the bus bars or the lead fingers.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
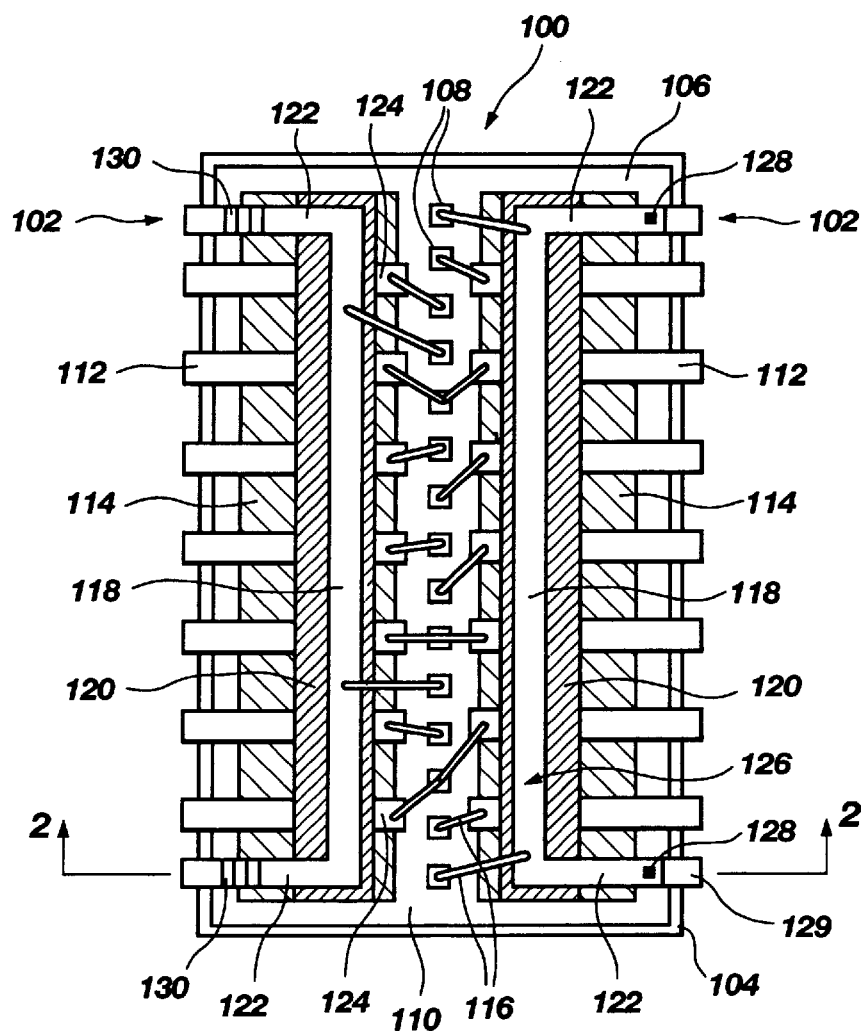
FIG. 1 is a top view of a semiconductor device which illustrates a leadframe configuration employing two embodiments of the present invention.
Figure 2:
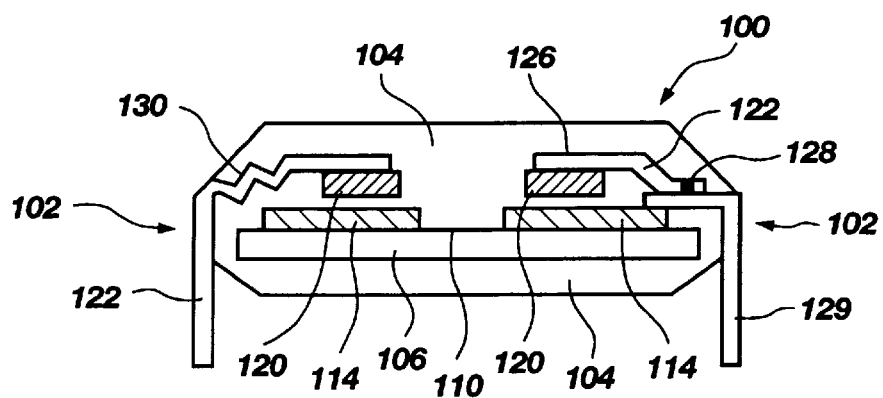
FIG. 2 is a cross-sectional side view of the semiconductor device of FIG. 1 taken along line 2—2.

As illustrated in FIGS. 1 and 2, a semiconductor device 100 having a multilevel leadframe 102 of the present invention is shown in FIG. 1 with an upper portion of encapsulant material 104 removed. A semiconductor die 106 has a plurality of bond pads 108 located in a row on the upper surface 110 and along the central axis of the semiconductor die 106. The leadframe 102 has a plurality of lead fingers 112 that extend toward the center of the semiconductor die 106. The lead fingers 112 are secured to the upper surface 110 of the semiconductor die 106 in an LOC configuration by a strip of adhesive tape or other adherent dielectric material 114 which acts as an insulator between the lead fingers 112 and the semiconductor die 106. The lead fingers 112 are electrically connected to the bond pads 108 by bond wires 116. The leadframe 102 also has one or more bus bars 118 lying adjacent to the bond pads 108 and extending substantially transversely to the lead fingers 112. The bus bars 118 are separated from the lead fingers 112 by a strip of tape or insulator 120 so that there is no electrical connection between the bus bars 118 and the lead fingers 112. Typically, the bus bars 118 each extend between two distal lead fingers 122 lying parallel to lead fingers 112. The bus bars 118 may provide ground and/or power sources to the semiconductor die 106. A bus bar 118 may also act as a lead for carrying any desired signal to the semiconductor die 106. In the present invention, the bus bars 118 are located above the lead fingers 112 and behind or outboard of the bond ends 124 of the lead fingers 112, but still in close proximity to bond pads 108. Thus, a multilevel leadframe 102 is obtained such that the bond wires 116 do not have to cross over the bus bars 118 to be electrically connected to the lead fingers 112.

Figure 3:
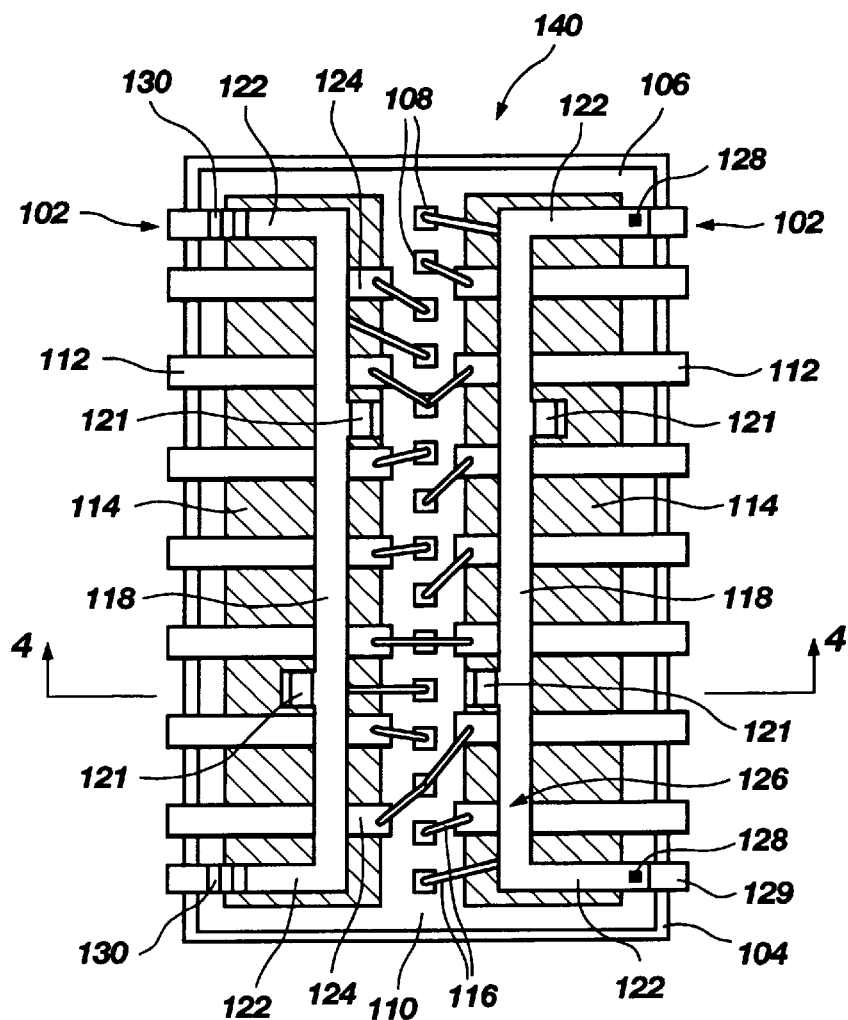
FIG. 3 is a top view of a semiconductor device which illustrates a leadframe configuration employing another embodiment of the present invention.
Figure 4:
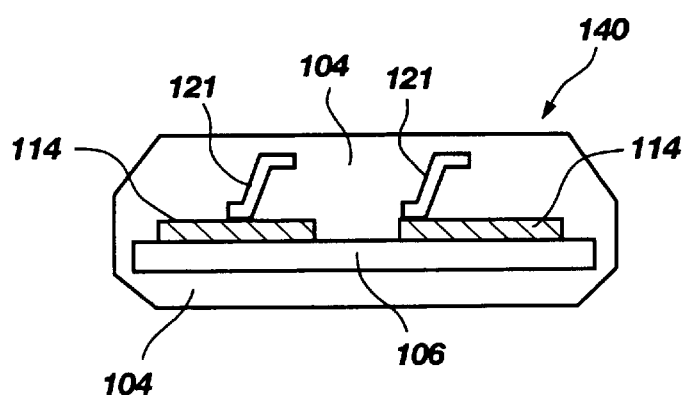
FIG. 4 is a cross-sectional side view of the semiconductor device of FIG. 3 taken along in 4—4.

Alternatively, as shown in FIGS. 3 and 4 (components common to FIGS. 1 and 2, and FIGS. 3 and 4 retain the same numeric designation), the strip of tape or insulator 120 of FIGS. 1 and 2 which prevents electrical connection between the bus bars 118 and the lead fingers 112 can be replaced by extensions or supports 121. Extensions or supports 121 extend from the bus bars 118 downwardly to the dielectric material 114 to maintain the elevation of bus bars 118 above lead fingers 112, thereby preventing electrical connection between the bus bars 118 and the lead fingers 112. When the semiconductor die 106 is encapsulated in the encapsulant material 104, the encapsulant material 104 flows under the bus bars 118 during transfer molding to form a permanent insulative barrier between the bus bars 118 and the lead fingers 112.

Referring to either FIGS. 1 and 2, or FIGS. 3 and 4, the multilevel configuration may be accomplished in several ways. The bus bar 118 and the distal lead fingers 122 may comprise a secondary leadframe 126 that is separate from the leadframe 102, as depicted on the right-hand side of drawing FIGS. 1–3. In one embodiment, the bus bar 118, the distal lead fingers 122, and the lead fingers 112 are initially formed from a single piece of conductive material and the bus bar 118 and a portion of the distal lead fingers 122 are subsequently detached to form the secondary leadframe 126. The distal lead finger portion 122 attached to the bus bar 118 is bent to position the bus bar 118 above the lead fingers 112 in cantilever fashion (see FIG. 2) when this secondary leadframe 126 is reattached to the leadframe 102. The secondary leadframe 126 may be attached to the leadframe 102 by spot welds 128 between the distal lead fingers 122 and truncated lead fingers 129 on the lead frame 102, by a conductive adhesive or by using other well known lead bonding techniques.

The leadframe 102 may also be formed as a single piece of conductive material, such as a metal sheet, as is typically done in a conventionally-configured leadframe (see FIGS. 1–3, left-hand side). The distal lead fingers 122 may then be crimped or bent to form bends 130 (see FIG. 2, left-hand side) so that the distal lead fingers 122 are effectively shortened and the bus bars 118 are elevated (cantilevered) above the lead fingers 112. The result is that the lead fingers 112 lie in one plane while the bus bars 118 lie in another superior plane. With the bus bars 118 and lead fingers 112 in separate planes, the bus bars 118 may be positioned behind, or outboard, of the bond ends 124 of the lead fingers 112. In this manner, electrical connections can be made between the bond pads 108 and the lead fingers 112 and between the bond pads 108 and the bus bars 118 without the need to cross the bond wires 116 over the bus bars 118.

Figure 5:
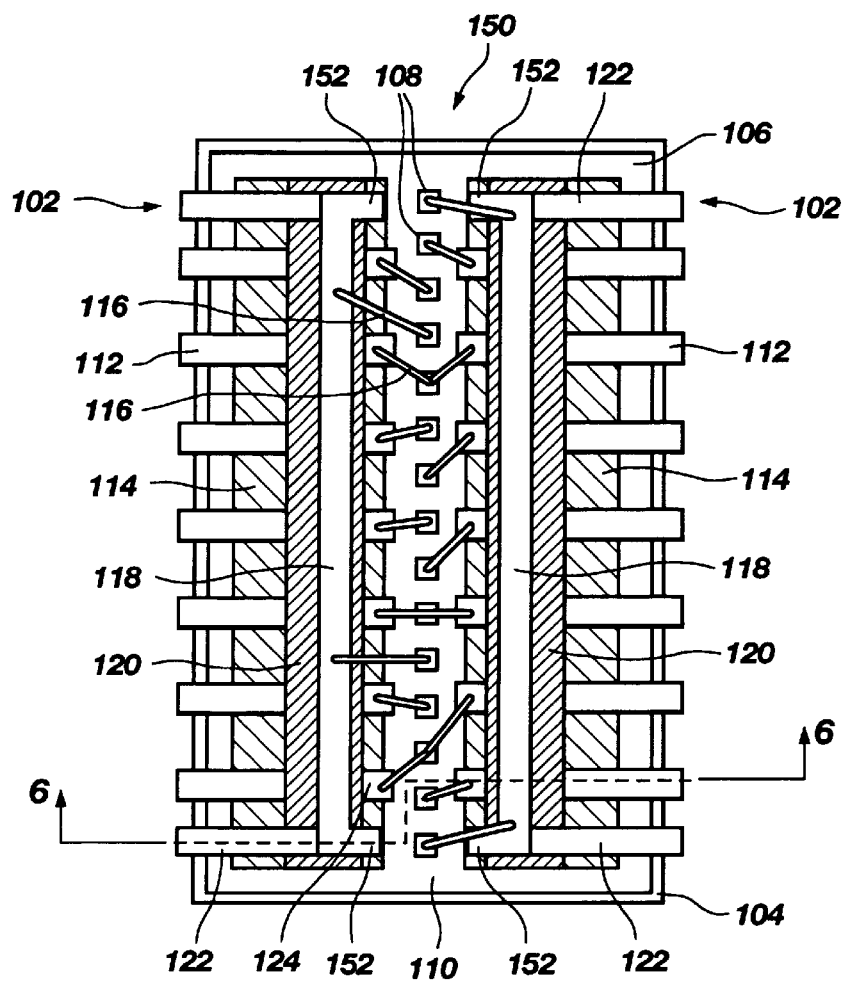
FIG. 5 is a top view of a semiconductor device which illustrates a leadframe configuration employing yet another embodiment of the present invention.
Figure 6:
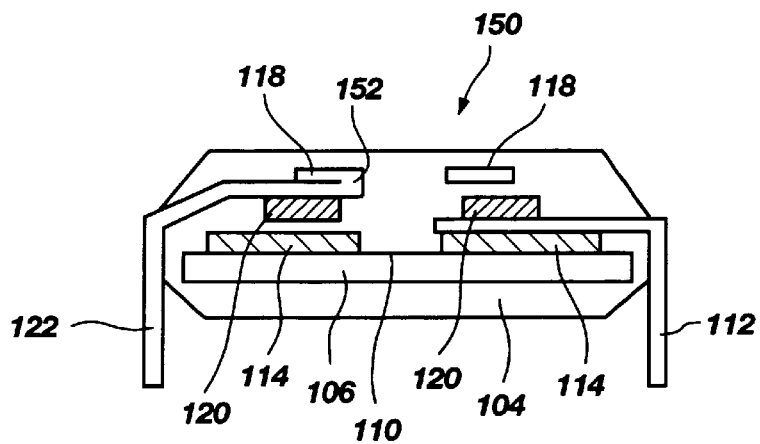
FIG. 6 is a cross-sectional side view of the semiconductor device of FIG. 5 taken along 6—6.

FIGS. 5 and 6 illustrate an alternative embodiment of the present invention. The semiconductor device 150 of FIG. 5 is similar to the semiconductor device 100 of FIGS. 1 and 2; therefore, components common to both FIGS. 1 and 2 and FIGS. 5 and 6 retain the same numeric designations. The alternative embodiment of FIGS. 5 and 6 differs from the embodiment of FIGS. 1 and 2 only in the configuration of the bus bars 118. In this embodiment, the multilevel configuration is accomplished using a single leadframe formed from a single piece of material. The distal lead fingers 122 are folded up, back and over at fold 152 so that the bus bars 118 are disposed over the lead fingers 112. The bus bars 118 may be positively separated (as shown) from the other lead fingers 112 lying between distal lead fingers 122 by a strip of tape or other insulator 120 so that there is no electrical connection between the bus bars 118 and the underlying lead fingers 112. Thus, a multilevel leadframe is obtained such that the bond wires 116 do not have to cross over the bus bars 118 to be electrically connected to the lead fingers 112.

Figure 7:
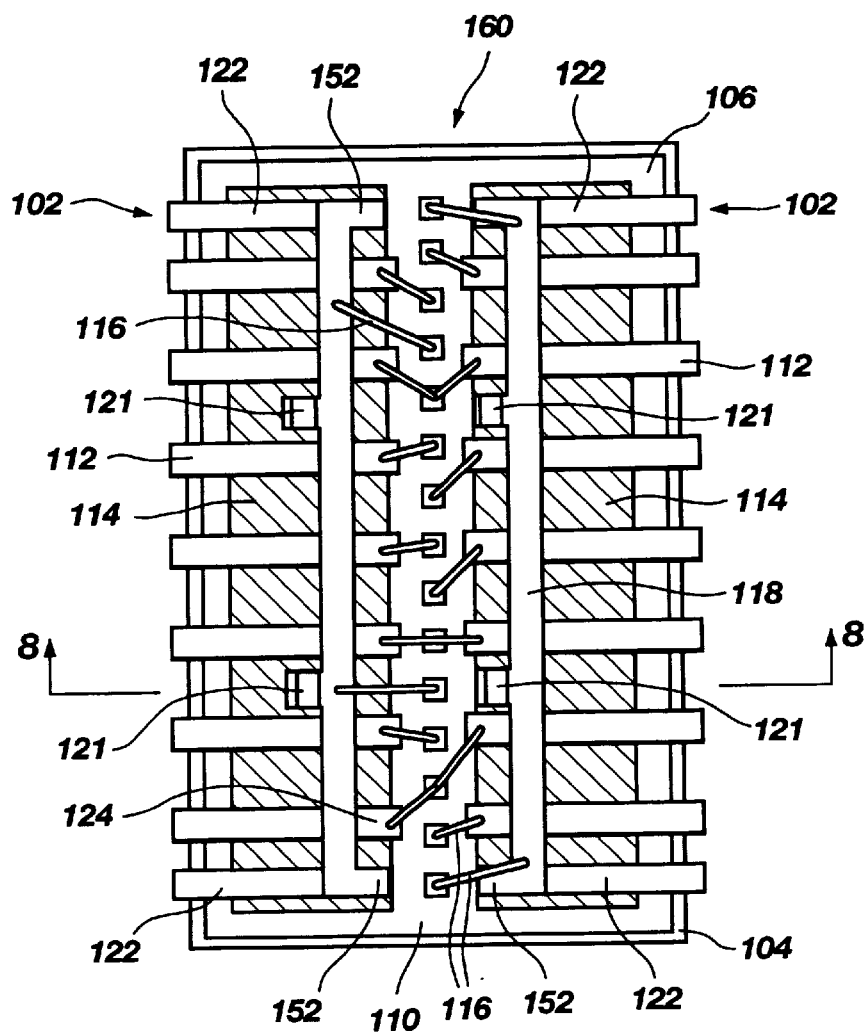
FIG. 7 is a top view of a semiconductor device which illustrates a leadframe configuration employing still another embodiment of the present invention.
Figure 8:
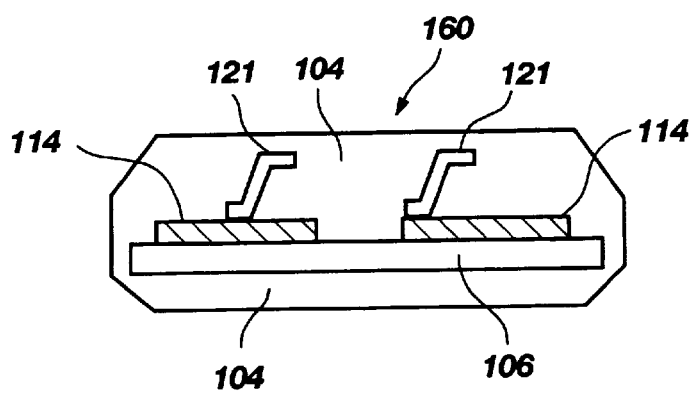
FIG. 8 is a cross-sectional side view of a semiconductor device of FIG. 7 taken along line 8—8.

Alternately, as shown in FIGS. 7 and 8 (components common to FIGS. 1 through 8 retina the same numeric designation), the strip of tape or insulator 120 of FIGS. 5 and 6 which prevents electrical connection between the bus bars 118 and the lead fingers 112 can be omitted, isolation of lead fingers 112 from bus bars 118 being effected by extensions or supports 121. Extensions or supports 121 extend from the bus bars 118 to the dielectric material 114 to which lead fingers are adhered, thereby preventing electrical connection between the bus bars 118 and the lead fingers 112. When the semiconductor die 106 is encapsulated in the transfer-molded fluid polymer material 104, the material 104 flows under the bus bars 118 to form a permanent insulative barrier between the bus bars 118 and the modified lead fingers 112. The extensions or supports 121 may be stamped from the same material as the bus bar 118 and deformed as required, or may be formed of a separate material, such as an insulating material, then attached to the bus bar 118 as with an adhesive. Alternatively, extensions or supports 121 may be extruded, printed or otherwise applied in flowable forms to the leadframe. It will be appreciated that, in the embodiment of FIGS. 6 and 7, the bending back of distal lead fingers 122 should be effected over a large radius, or comprise two substantially 90° bands separated by an intervening vertical segment, so as to raise bus bars 118 above previously-coplanar lead fingers 112.

Figure 9:
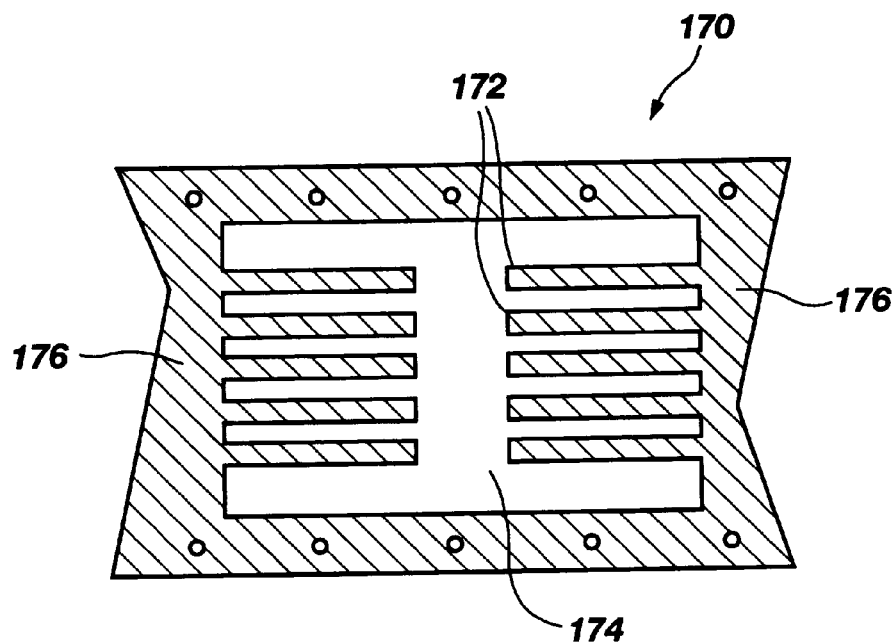
FIG. 9 is a top plan view of a lower leadframe used in an embodiment of the present invention.
Figure 10:
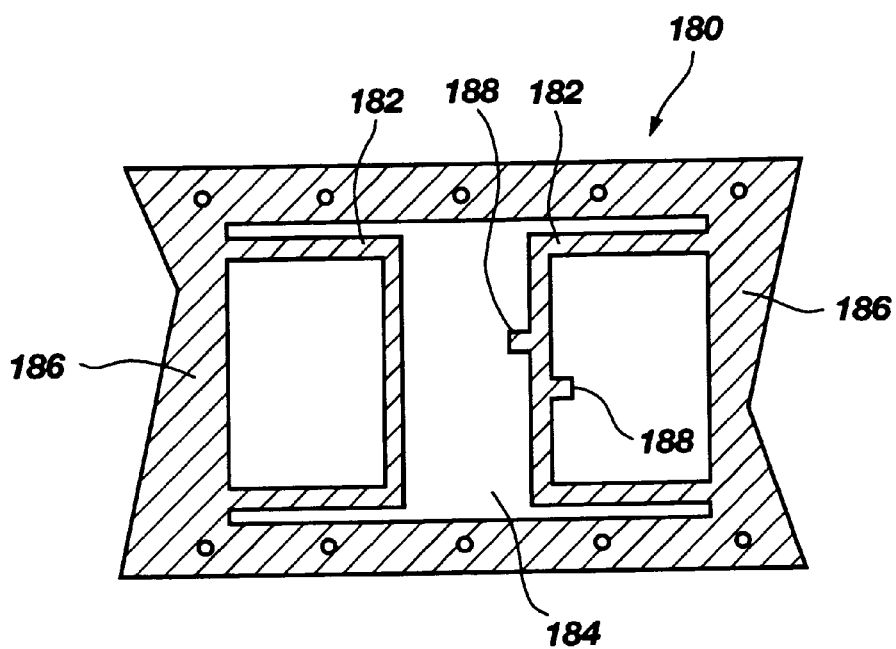
FIG. 10 is a top plan view of an upper leadframe used in an embodiment of the present invention.
Figure 11:
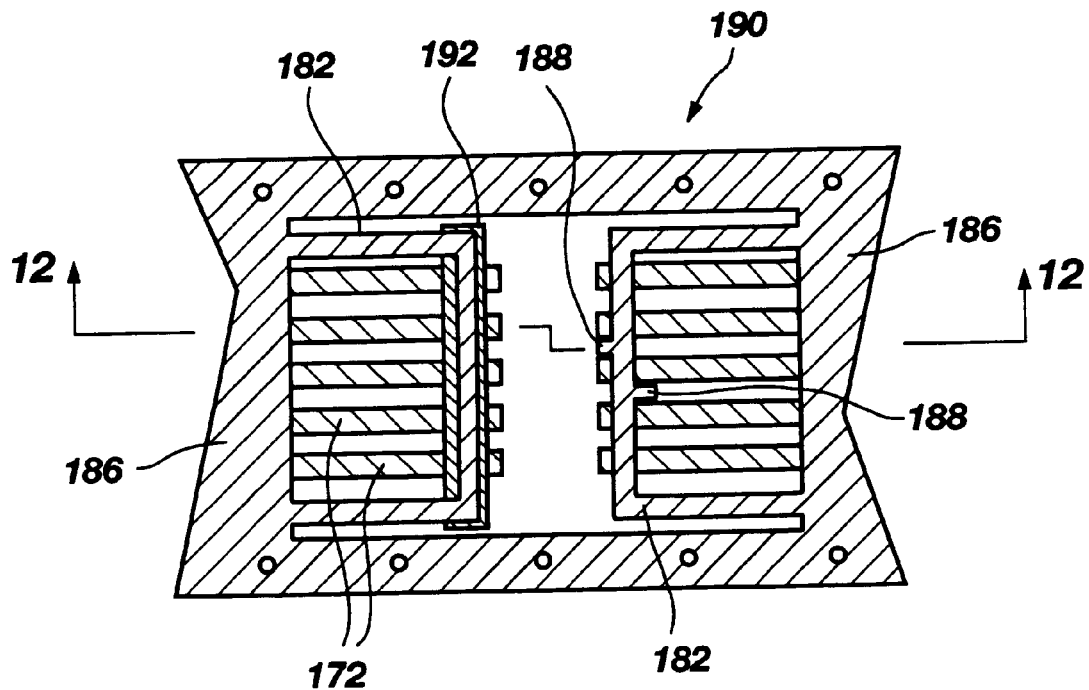
FIG. 11 is a top plan view of the upper leadframe of FIG. 10 atop the lower leadframe of FIG. 9.
Figure 12:
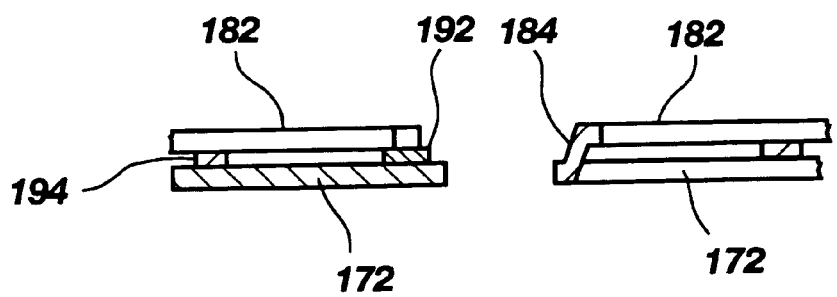
FIG. 12 is a cross-sectional side view of the leadframe configuration of FIG. 11 taken along line 12—12.

The present invention may also be achieved by combining two leadframes as shown in FIGS. 9–12. FIG. 9 illustrates a first leadframe 170 with a plurality of lead fingers 172 extending into an open portion 174 of a first leadframe perimeter support portion 176. FIG. 10 illustrates a second leadframe 180 with bus bars 182 extending into an open portion 184 of a second lead frame perimeter support portion 186. The bus bars may also have extensions or supports 188, as previously described in FIGS. 3 and 4 as extensions or supports 121. As shown in FIGS. 11 and 12, the second leadframe 180 is placed atop the first leadframe 170 to form the stacked leadframe 190. If extensions 188 are not being utilized, a strip of tape or insulator 192 between the bus bar 182 and the lead fingers 172 may be used to prevent electrical contact.

Figure 13:
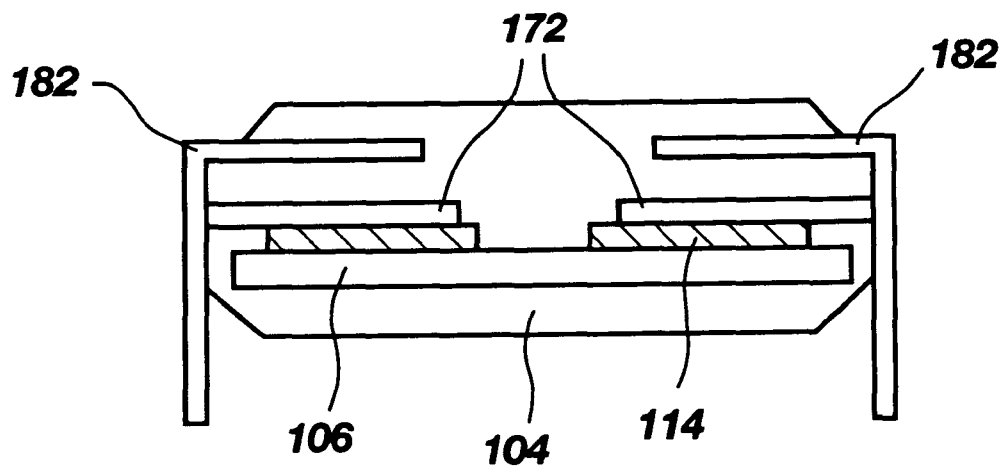
FIG. 13 is a cross-sectional side view of the leadframe configuration of FIG. 11 after a trim and form process and encapsulation without bending the bus bars to the same plane as the lead fingers.
Figure 14:
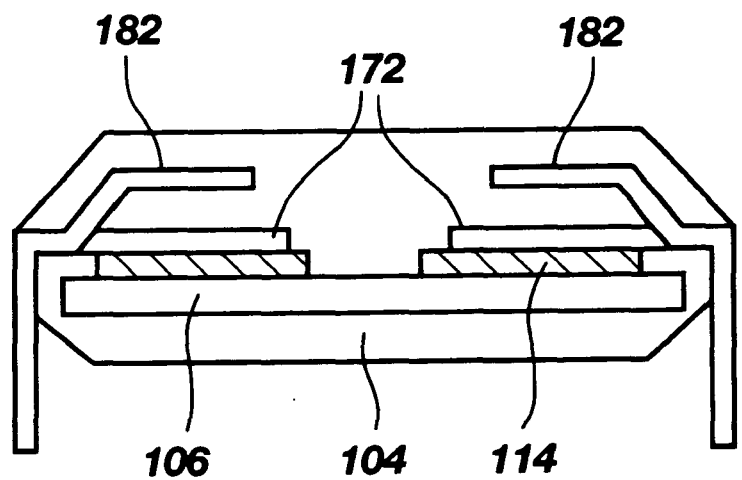
FIG. 14 is a cross-sectional side view of the leadframe configuration of FIG. 11 after a trim and form process and encapsulation with the bus bars bent to the same plane as the lead fingers.
Figure 15:
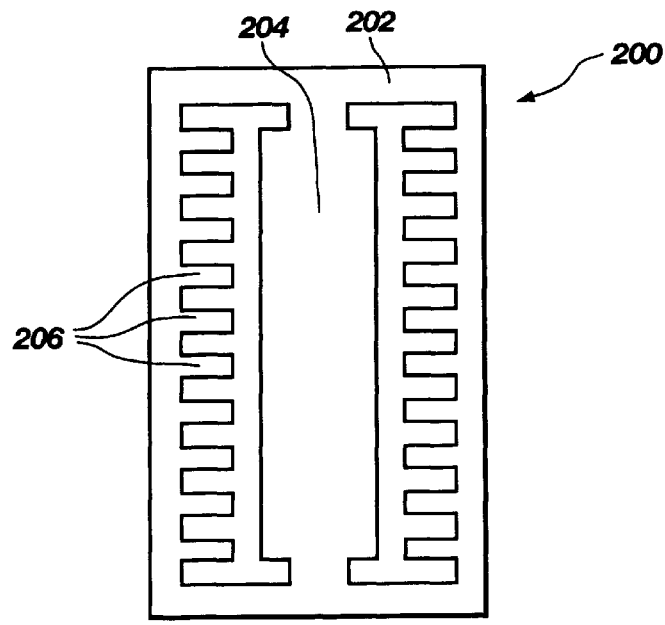
FIG. 15 is a top plan view of a prior art leadframe.
Figure 16:
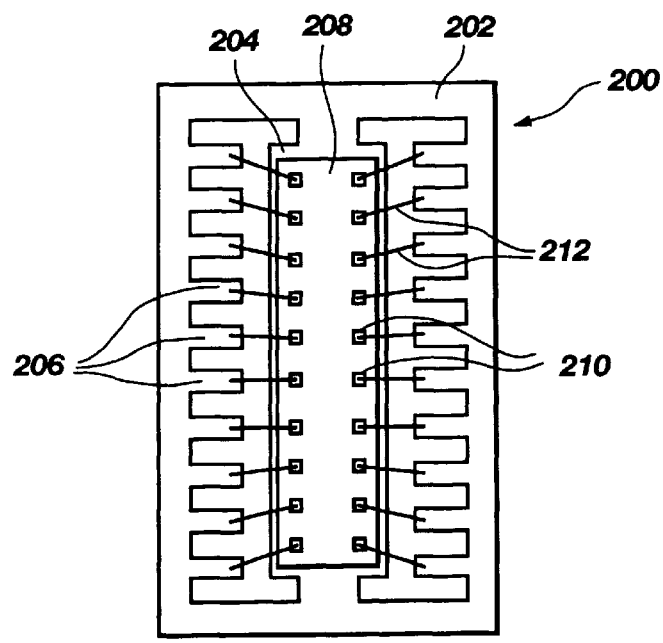
FIG. 16 is a top plan view of a prior art leadframe with a semiconductor chip attached thereto.
Figure 17:
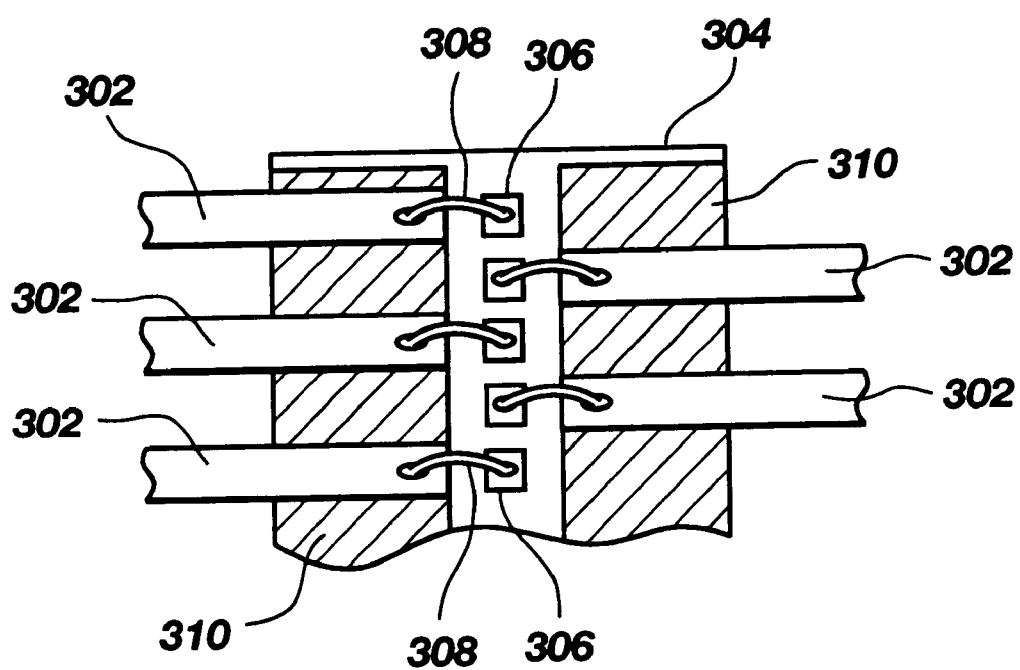
FIG. 17 is a top plan view of a prior art semiconductor device using a LOC type configuration.
Figure 18:
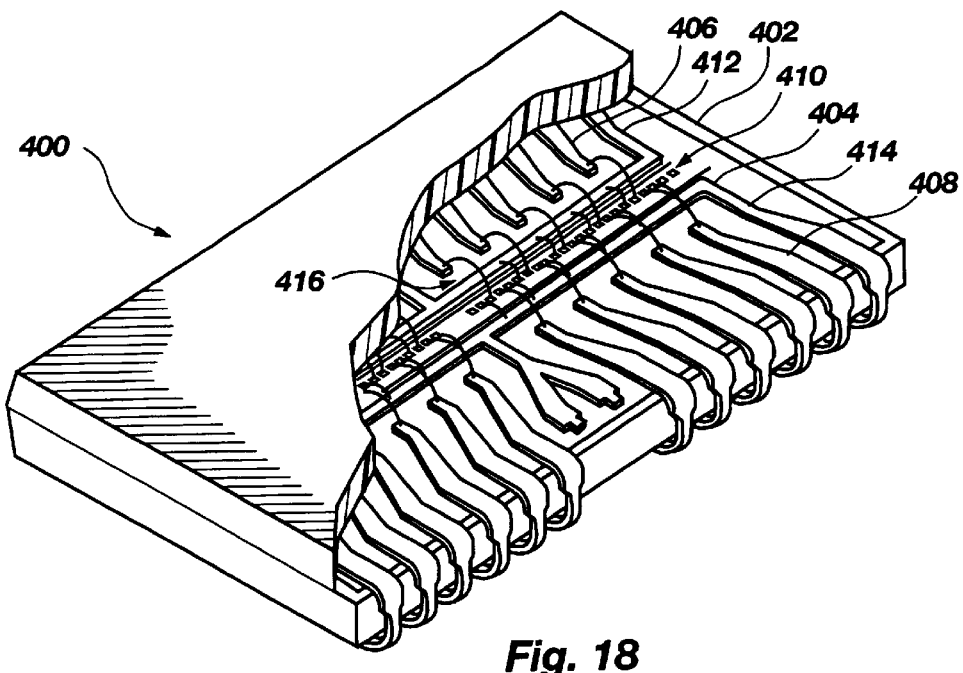
FIG. 18 is a perspective view, partially broken away, of a prior art packaged semiconductor device using a LOC type configuration with a bus bar.
Figure 19:
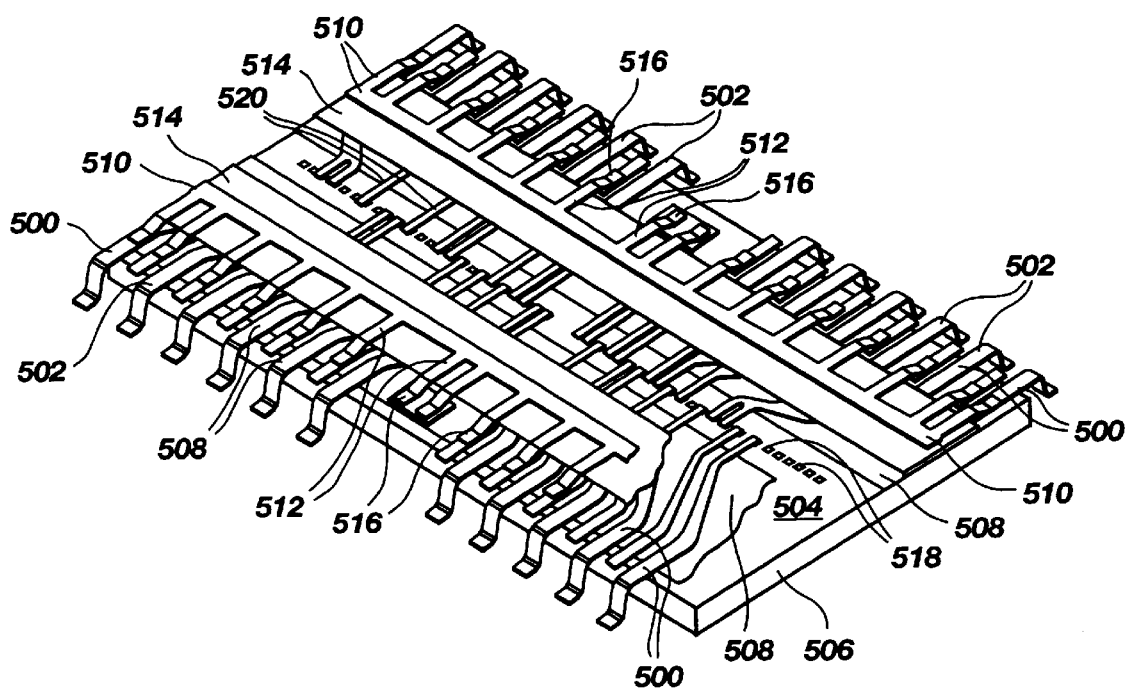
FIG. 19 is a perspective view, partially broken away, of a prior art packaged semiconductor device of a prior art technique of forming a multilevel leadframe.
Figure 20:
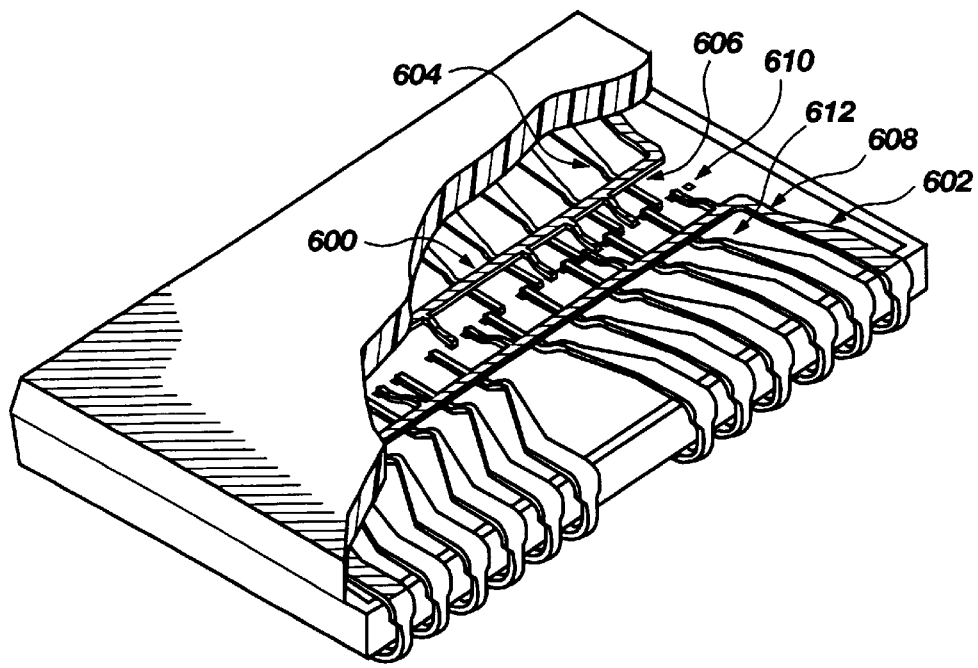
FIG. 20 is a cut-away isometric perspective of a prior art technique of forming a multilevel leadframe.
Figure 21:
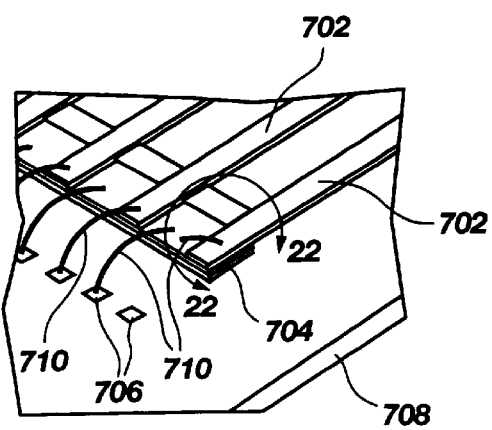
FIG. 21 is a close-up isometric view of a prior art technique of folding the bus bar underneath the leadframe.
Figure 22:
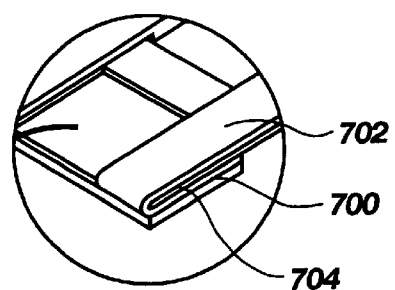
FIG. 22 is an enlarged close-up isometric view of a prior art technique of folding the bus bar underneath the leadframe.
Figure 23:
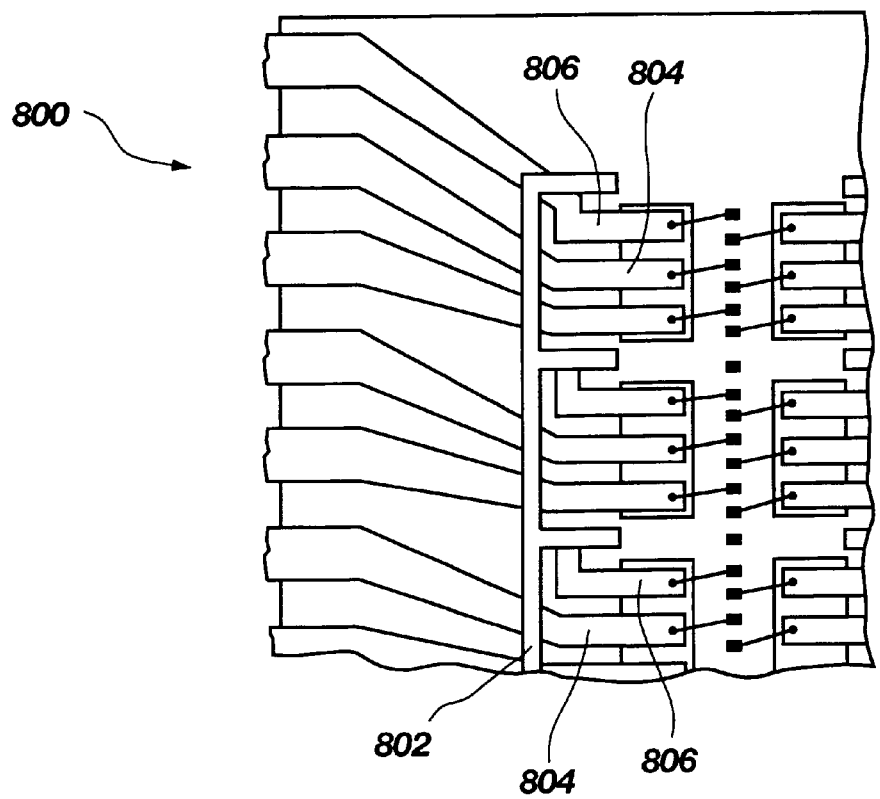
FIG. 23 is a top plan view of a prior art leadframe attached to a semiconductor device.
Figure 24:
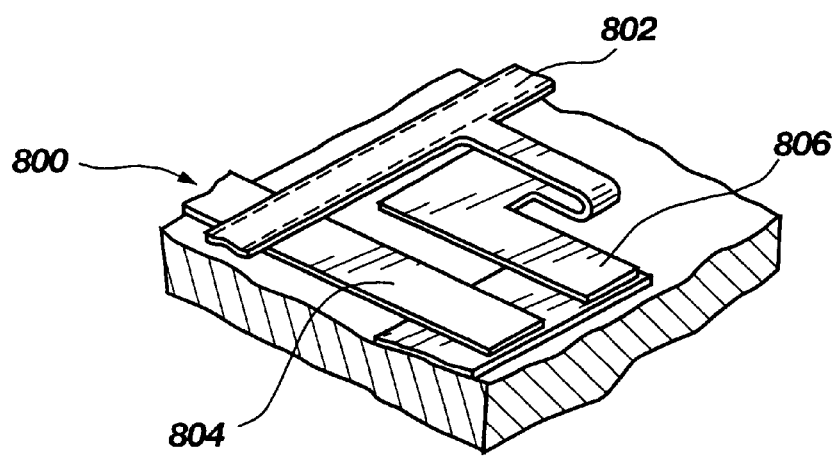
FIG. 24 is an oblique view of the prior art leadframe of FIG. 23.

The first 180 170 and second leadframe 180 of the stacked leadframe 190 may remain offset from one another after trim and form and encapsulation, in which case spacers 194, as shown in FIG. 12 are used between the first and second leadframe support portion 176 and 186, respectively. If the first leadframe 170 and second leadframe 180 of the stacked leadframe 190 remain offset, the bus bars 182 and the lead fingers 172 will exit an encapsulate or package 196 at different levels, as shown in FIG. 13. However, the parallel, digital portions of bus bars 182 may be bent downwardly during trim and form, prior to encapsulation, to exit on the same level or plane as the lead fingers 172, as shown in FIG. 14.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of fabricating a multilevel leadframe for electrical connection to a semiconductor die, comprising:

forming at least one lead finger and at least one bus bar from a single piece of conductive material;

wherein said at least one lead finger is formed to include a segment occupying a first plane, and wherein said at least one lead finger includes a bond end for electrical connection to at least one of a plurality of bond pads disposed on an interior portion of an active surface of said semiconductor die;

wherein said at least one bus bar is formed to include a pair of distal lead fingers and a transverse bar extending between said pair of distal lead fingers, said transverse bar extending substantially perpendicular to said at least one lead finger; and crimping a plurality deformations in each distal lead finger of said pair of distal lead fingers to position said transverse bar and at least a portion of said distal lead fingers in a second plane above said first plane and a distance farther from said plurality of bond pads than said at least one lead finger bond end when said multilevel leadframe is located on said active surface of said semiconductor die, and wherein said transverse bar provides a surface for an electrical connection between said transverse bar and at least one of said plurality of bond pads by extension of at least one conductive element therebetween.

2. The method of claim 1, further comprising disposing a dielectric material between said at least one lead finger and said at least one bus bar.

3. The method of claim 1, further including providing extensions extending from said transverse bar in said second plane to support said transverse bar above said first plane.

4. A method of fabricating a multilevel leadframe for electrical connection to a semiconductor die, comprising:

forming at least one lead finger and at least one bus bar from a single piece of conductive material;

wherein said at least one lead finger is formed to include a segment occupying a first plane, and wherein said at least one lead finger includes a bond end for electrical connection to at least one of a plurality of bond pads disposed on an interior portion of an active surface of said semiconductor die;

wherein said at least one bus bar is formed to include a pair of distal lead fingers and a transverse bar extending between said pair of distal lead fingers, said transverse bar extending substantially perpendicular to said at least one lead finger; and severing each distal lead finger of said pair of distal fingers into a first severed distal lead finger portion and a second severed distal lead finger portion, said second distal lead finger portions being adjacent said transverse bar;

bending said second severed distal lead finger portions; and reattaching said second severed distal lead finger portions to said first severed distal lead finger portions to position said transverse bar and at least a portion of said distal lead fingers in a second plane above said first plane and a distance farther from said plurality of bond pads than said at least one lead finger bond end when said multilevel leadframe is located on said active surface of said semiconductor die, and wherein said transverse bar provides a surface for an electrical connection between said transverse bar and at least one of said plurality of bond pads by extension of at least one conductive element therebetween.

5. The method of claim 4, wherein reattaching said second severed distal lead finger portions to said first several distal lead finger portions comprises spot welding.

6. A method of fabricating a semiconductor device, comprising:

providing a semiconductor die having a plurality of bond pads disposed on an interior portion of an active surface thereof;

forming, from a single piece of conductive material, at least one lead finger including a bond end and at least one bus bar including a pair of distal lead fingers and a transverse bar extending therebetween with said transverse bar extending substantially perpendicular to said at least one lead finger;

attaching said at least one lead finger to said semiconductor die with said at least one lead finger at least partially disposed in a first plane;

attaching said at least one bus bar to said semiconductor die;

crimping a plurality of deformations in each distal lead finger of said pair of distal lead fingers to position said transverse bar and at least a portion of each of said distal lead fingers of said pair in a second plane above said first plane and a distance farther from said plurality of bond pads than said at least one lead finger bond end;

attaching a conductive element between said at least one lead finger bond end and at least one bond pad of said plurality of bond pads; and attaching a conductive element between said transverse bar and at least one bond pad of said plurality of bond pads.

7. The method of claim 6, further comprising disposing a dielectric material between said at least one lead finger and said at least one bus bar.

8. The method of claim 6, further including providing extensions extending from said transverse bar in said second plane to support said transverse bar above said first plane.

9. A method of fabricating a semiconductor device, comprising:

providing a semiconductor die having a plurality of bond pads disposed on an interior portion of an active surface thereof;

forming, from a single piece of conductive material, at least one lead finger including a bond end and at least one bus bar including a pair of distal lead fingers and a transverse bar extending therebetween with said transverse bar extending substantially perpendicular to said at least one lead finger;

attaching said at least one lead finger to said semiconductor die with said at least one lead finger at least partially disposed in a first plane;

attaching said at least one bus bar to said semiconductor die;

severing each distal lead finger of said pair of distal lead fingers into a fist severed distal lead finger portion and a second severed distal lead finger portion, said second distal lead finger portions being adjacent said transverse bar;

bending said second severed distal lead finger portions; and reattaching said second severed distal lead finger portions to said first severed distal lead finger portions to position said transverse bar and at least a portion of each of said distal lead fingers of said pair in a second plane above said first plane and a distance farther from said plurality of bond pads than said at least one lead finger bond end;

attaching a conductive element between said at least one lead finger bond end and at least one bond pad of said plurality of bond pads; and attaching a conductive element between said transverse bar and at least one bond pad of said plurality of bond pads.

10. The method of claim 9, wherein reattaching said second severed distal lead finger portions to said first severed distal lead finger portions comprises spot welding.

11. The method of claim 4, further comprising disposing a dielectric material between said at least one lead finger and at least one said bus bar.

12. The method of claim 4, further including providing extensions extending from said transverse bar in said second plane to support said transverse bar above said first plane.

13. The method of claim 9, further comprising disposing a dielectric material between said at least one lead finger and said at least one bus bar.

14. The method of claim 9, further including providing extensions extending from said transverse bar in said second plane to support said transverse bar above said first plane.

* * * * *